United States Patent [19]

Shiba

[11] 4,306,915
[45] Dec. 22, 1981

[54] METHOD OF MAKING ELECTRODE WIRING REGIONS AND IMPURITY DOPED REGIONS SELF-ALIGNED THEREFROM

[75] Inventor: Hiroshi Shiba, Tokyo, Japan

[73] Assignee: Nippon Electric Co., Ltd., Tokyo, Japan

[21] Appl. No.: 32,427

[22] Filed: Apr. 23, 1979

[30] Foreign Application Priority Data

Apr. 21, 1978 [JP] Japan ................... 53-48042

[51] Int. Cl.³ ................ H01L 21/263; H01L 21/26; B01J 17/00
[52] U.S. Cl. .......................... 148/1.5; 29/571; 29/591; 148/187; 357/23; 357/59; 357/91
[58] Field of Search ............. 148/1.5, 187; 29/591, 29/571; 357/23, 91, 59

[56] References Cited

U.S. PATENT DOCUMENTS

| | | | |
|---|---|---|---|
| 4,069,067 | 1/1978 | Ichinohe | 148/1.5 |
| 4,127,931 | 12/1978 | Shiba | 29/571 |
| 4,160,683 | 7/1979 | Roche | 148/187 |
| 4,179,311 | 12/1979 | Athanas | 148/1.5 |

*Primary Examiner*—Upendra Roy
*Attorney, Agent, or Firm*—Sughrue, Mion, Zinn, Macpeak & Seas

[57] ABSTRACT

A semiconductor device suitable for a high-density integrated circuit is disclosed. The semiconductor device comprises an electrode wiring layer made of silicon with a substantially flat surface deposited on a major surface of a semiconductor substrate, the periphery of which is filled with an insulating layer produced by selectively oxidizing the silicon, a first impurity doped region formed in the semiconductor substrate in self-aligning relation with the electrode wiring layer, and a second impurity doped region coupled to the first impurity doped region and underlain the insulating layer.

17 Claims, 21 Drawing Figures

METHOD OF MAKING ELECTRODE WIRING REGIONS AND IMPURITY DOPED REGIONS SELF-ALIGNED THEREFROM

The present invention relates to a semiconductor device and, more particularly, to a field-effect semiconductor device.

There are two basic types of field-effect transistors, one of which is the junction field-effect transistor (hereinafter abbreviated as JFET) and the other is the metal oxide semiconductor field-effect transistor (hereinafter abbreviated as MOSFET). In order to improve the electric characteristics of those transistors, many attempts have been made for reducing the areas of gate, drain and source regions, the length of a channel and a stray capacitance between a gate and a drain or a source. In a MOSFET of silicon gate type, for example, a polycrystalline silicon layer overlaying a major surface of a semiconductor substrate is selectively etched away to form electrode wiring paths. Then, impurity is doped into the substrate to form the drain and source regions. This method is advantageous in that a small value of stray capacitance between the gate and the drain or the source can be realized because the gate electrode is disposed in self-aligning relation with the drain and source regions. However, the substrate surface is rugged with a depth corresponding to the thickness of the polycrystalline silicon layer. Accordingly, when metal wiring paths are layered for connecting electrode wiring paths, one frequently encounters disconnection or shortcircuiting. Therefore, this hinders a minute patterning the semiconductor device fabrication. While a vertical structure type transistor recently developed significantly improves the channel length problem but inherently suffers from a stray capacitance between gate and source or drain.

Accordingly, an object of the invention is to provide a semiconductor device with a fairly reduced stray capacitance in question and allowing a minute patterning of metal wiring paths.

Another object of the invention is to provide a method for easily and reliably manufacturing a semiconductor device with a substantially flat electrode wiring layer, with a self-aligning relationship of a drain and a source with a gate.

According to this invention, there is provided a semiconductor device comprising an electrode wiring layer made of silicon with a substantially flat surface which adheres to a major surface of a semiconductor substrate and of which the periphery is converted into insulating material, and an impurity doped region formed in the semiconductor substrate in self-aligning relation with said electrode wiring region.

According to this invention there is also provided a method for manufacturing a semiconductor device comprising the steps of: coating a major surface of a semiconductor substrate with a silicon layer; selectively adding impurity material into the substrate through a portion of the silicon layer; and selectively converting the portion of the silicon layer into an oxide where the impurity material has passed through.

According to this invention, there is also provided a method of manufacturing a semiconductor device comprising the steps of preparing a semiconductor substrate selectively covered with an insulating layer, depositing a silicon layer over the major surface of the semiconductor substrate, forming a mask pattern on the surface of the silicon layer, selectively adding impurity into the semiconductor substrate by using the mask pattern to form an impurity doped region therein and selectively oxidizing the silicon layer over its entire thickness by using the mask pattern to form an electrode wiring layer with a substantially flat surface made of the non-oxidized portion of the silicon layer.

In a semiconductor device according to the invention, impurity is selectively doped into a region of a semiconductor substrate, passing through a polycrystalline silicon layer coated over a major surface of the semiconductor substrate. Then, a portion of the polycrystalline silicon layer where the impurity has passed through, is selectively converted into a silicon dioxide, while the remaining non-oxidized polycrystalline silicon performs an electrode wiring path.

According to our invention, a substantially flat surface of electrode wiring path can be realized because the periphery of the electrode wiring layer is filled with the silicon dioxide which is selectively converted from the silicon layer. Furthermore, a small value of stray capacitance can be realized between the impurity doped region and the electrode wiring path because the there is no superposition between the electrode wiring path and the impurity doped region in a plane geometry.

Other objects and features of the invention will be apparent from the following description taken in connection with the accompanying drawings, in which.

Figure 3:
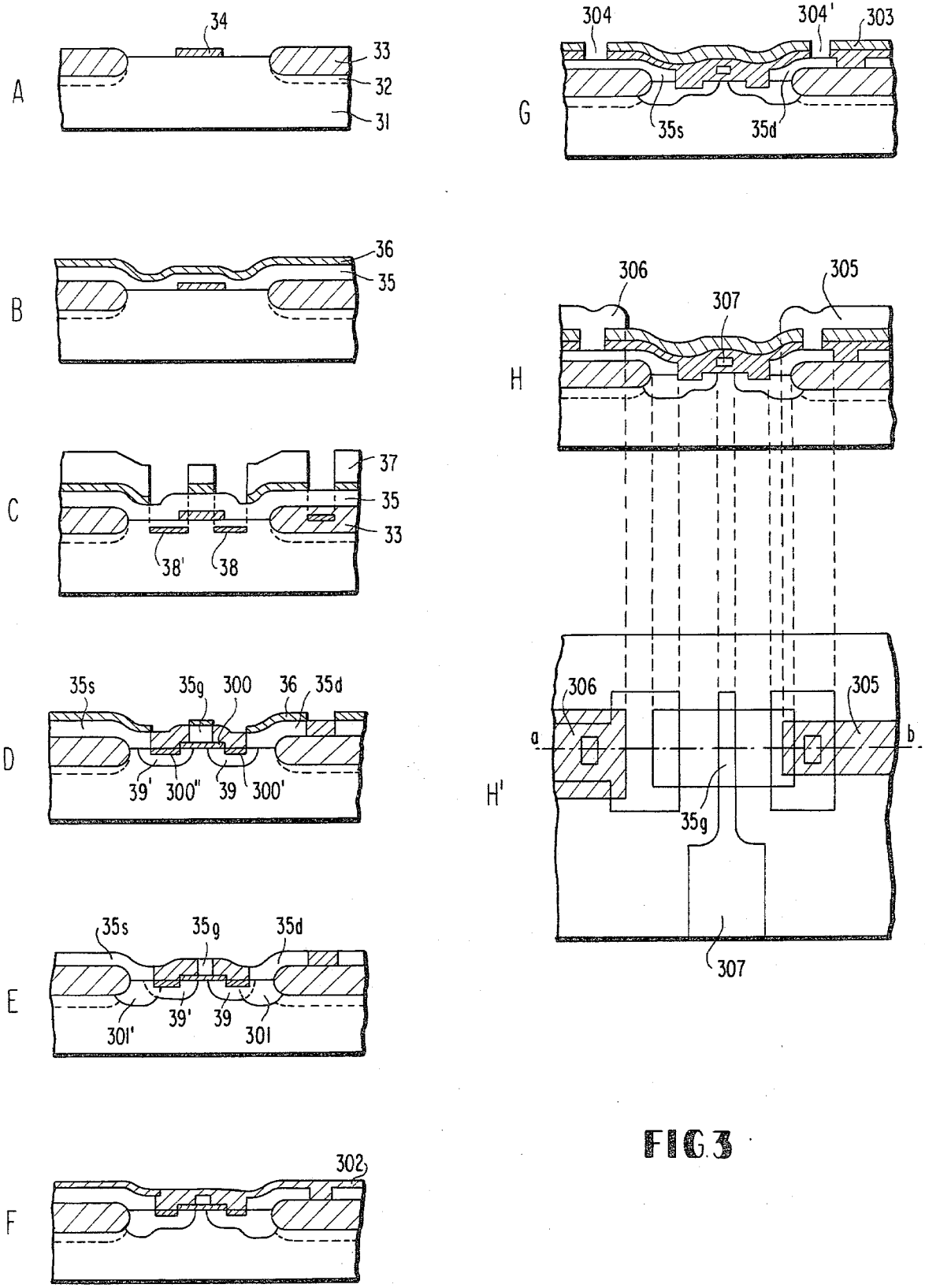
Figure 4:
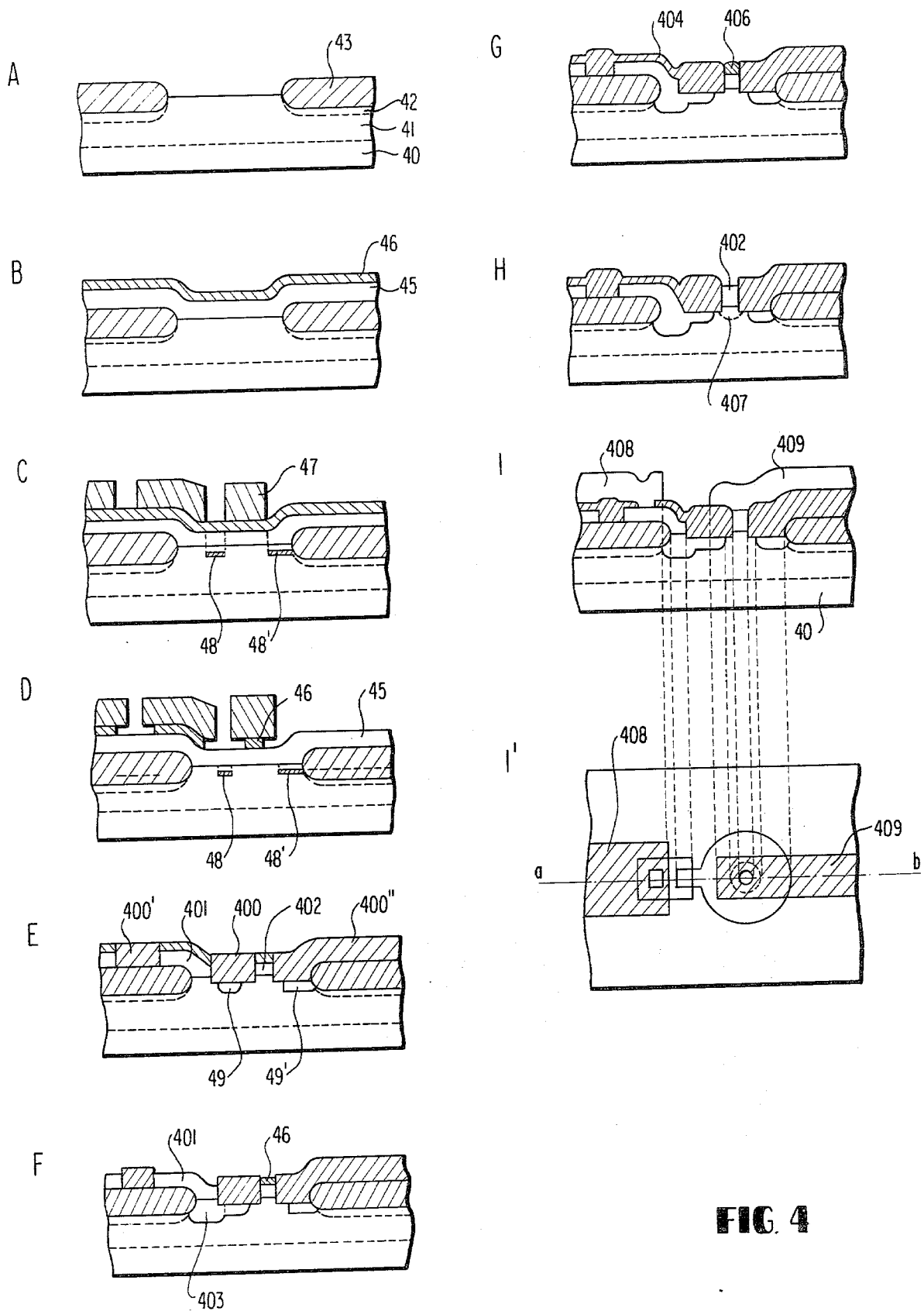

FIG. 3 shows manufacturing steps of a P-channel MOSFET which is a first embodiment according to the invention, in which FIGS. 3A to 3H are cross-sectional views and FIG. 3H' is a plan view of a diagram shown in FIG. 3H, and FIG. 4 shows manufacturing steps of an N-channel JFET which is a second embodiment according to the invention, in which FIGS. 4A to 4I are cross-sectional views and FIG. 4I' is a plan view of a diagram shown in FIG. 4I.

Figure 1:
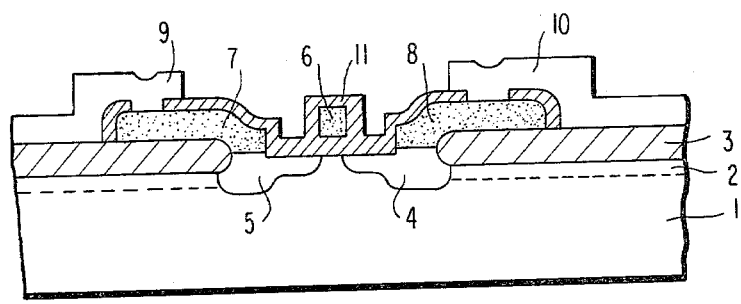
FIG. 1 shows a cross-sectional view of a conventional semiconductor device.

With reference to FIG. 1, a MOSFET of silicon gate type according to prior art will be described.

The MOSFET comprises a gate electrode 6, a drain electrode wiring path 7 connected to a drain region 5 and a source electrode wiring path 8 connected to a source region 4. In the MOSFET, a polycrystalline silicon layer overlaying a major surface of a semiconductor substrate 1 is selectively etched away to form separate pattern of electrode wiring paths 6 to 7. Then impurity is introduced into the substrate 1 to form the drain region 5 and the source region 4. The MOSFET has advantage in that a stray capacitance between the gate electrode 6 and the drain region 5 and/or the source region 4 can be made small value since both of the drain region 5 and the source region 4 are formed in self-aligning relation with the gate electrode 6. However, the gate electrode 6, the drain electrode 7 and the source electrode 8 make the upper surface of the substrate 1 rugged by a depth corresponding to the thickness of the polycrystalline layer. Therefore, when metal wiring paths 9 and 10 are layered, these wiring paths are frequently disconnected or shortcircuited. Accordingly, the MOSFET is not favorable for multi-layered construction of integrated circuits.

Figure 2:
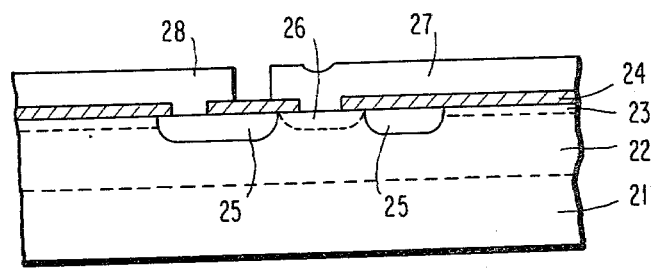
FIG. 2 shows a cross-sectional view of another conventional semiconductor device.

Then, with reference to FIG. 2, a JFET according to prior art will be briefly described. The JFET comprises a semiconductor substrate wherein a drain region 22, a source region 26 and a gate region 25, a gate electrode wiring path 28 and a source electrode wiring path 27. The wiring paths 27 and 28 are made of selectively etched polycrystalline silicon. This JFET has also the disadvantages in its rugged surface due to the wiring paths and in a large value of stray capacitance derived from superposition of the source electrode wiring path 27 on the gate region 25.

Reference is made to FIGS. 3A to 3H and 3H' illustrating a manufacturing process of a P-channel MOS FET which is a preferable embodiment according to the invention. First, an N-type impurity doped region 32 as a channel stopper, a silicon dioxide 33 of a 1 μm thick for insulating electrode wiring paths and a silicon dioxide layer 34 of 0.1 μm thick as a gate insulating film are formed on the surface or the surface area of an N-type silicon substrate 31 of resistivity 4 Ω-cm by a known manufacturing method, as shown in FIG. 3A A polycrystalline silicon film 35 of 0.2 μm thickness and a silicon nitride layer 36 of 0.2 μm thickness are successively deposited on the surface of the semiconductor substrate by known vapor deposition technique, as shown in FIG. 3B. A photoresist 37 of a 0.8 μm thick is then coated over the surface of the silicon nitride layer 36. And then the photoresist 37 and the silicon nitride layer 36 are removed except those at the location where electrode wiring paths are to be formed. Following this, boron is doped into the semiconductor substrate, by the ion implantation technique, to form P-type impurity doped regions 38 and 38', as shown FIG. 3C. In this example, the boron implantation is carried out preferably under a condition that the ion implantation energy is 400 KeV and the ion dosage is $10^{15}/cm^2$. At this time, boron is deeply doped to the depth of approximately 0.9 μm from the substrate surface; however, it fails to reach the substrate area covered with the silicon dioxide layer 33 or the thick photoresist 37. In this manner, selective doping of boron into the substrate is performed automatically. At the next step, the photoresist 37 is removed and the substrate is then subjected to a thermal oxidation treatment. In this embodiment, the thermal oxidation treatment is preferably conducted at a temperature of 1000° C. for about 4 hours. Through the thermal treatment, the polycrystalline silicon layer not covered with the silicon nitride layer 36 is completely converted into a silicon dioxide layer 300 to provide electrode wiring paths 35s, 35 g and 35d which are electrically isolated one another, and the boron 38 doped in the substrate diffuses therein to form source and drain regions 39 and 39' by the thermal diffusion. In this thermal diffusion, the surface of the substrate is slightly oxidized to form oxide regions 300' and 300" which are not essential and not necessary in our invention, as shown FIG. 3D. The silicon nitride layer 36 on the polycrystalline silicon layer is removed and then highly concentrated boron is added, by the thermal diffusion method, into the electrode wiring paths 35d, 35g and 35s and the semiconductor substrate 31 to form drain contact region 301 and source contact region 301', through the electrode wiring parths 35d and 35s. As a result, electrode wiring paths with low resistance are formed connecting to the source and drain regions 39' and 39 through the regions 301' and 301, as shown in FIG. 3E. Then, the substrate 31 is again subjected to the heat oxidation treatment to form a silicon dioxide layer 302 on the isolated polycrystalline silicon. The resultant surface of the substrate 31 provides a substantially flat surface, as shown in FIG. 3F. Further, in order to reduce a stray capacitance, a silicon dioxide film 303 with a 0.5 μm thick is deposited over the entire surface of the substrate. Subsequently, openings 304 and 304' allowing the connection of the metal electrode wiring paths to the electrode wiring paths 35d and 35s are formed in the silicon oxide layer 303 (FIG. 3G). Finally, metal wiring paths 305 and 306 made of aluminum are formed, by which the openings 304 are filled, as shown in FIG. 3H. The P-channel MOS field effect transistor thus fabricated has a drain electrode of the metal wiring path 305, a source electrode of a metal wiring path 306, and a gate wiring path 307 extending from the polycrystalline silicon gate electrode 35g, as shown in FIGS. 3H and H'.

According to this invention, the metal wiring paths 305 and 306 are formed on the substantially flat surface of the substrate and hence the metal wiring paths 305 and 306 never encounter disconnection or shortcircuit. Further, the stray capacitance between the gate electrode 35g and the drain and source regions 39 and 39' can be remarkably reduced because the periphery of the gate electrode 35g substantially coincides with the peripheries of the drain and source regions 39 and 39' at the channel side in plane geometry.

Turning to FIGS. 4A to 4 I and 4I', there is shown a series of manufacturing steps of an N-channel junction type field effect transistor which is another embodiment according to the invention. To start, an N-type silicon monocrystalline layer 41 of 1Ω-cm resistivity is epitaxially grown on the major surface of an N-type silicon substrate 40 of 0.01Ω-cm and N-type impurity doped area 42 for channel prevention as a channel stopper and a silicon dioxide film 43 of 1 μm thick are formed as shown in FIG. 4A. Then, over the entire surface of the semiconductor substrate are successively grown a polycrystalline silicon thin layer 45 of 0.4 μm thick and a silicon nitride layer 46 of 0.2 μm thick, as shown in FIG. 4B. After this, the surface of the silicon nitride layer 46 is coated with a photoresist 47 of 0.8 μm thick. Then, the photoresist 47 is removed except for the portion of the photoresist 47 to be electrode wiring paths. After the removal of the partial photoresist, boron is doped into the semiconductor substrate by the ion implantation technique to form a P-type impurity doped region 48', as shown in FIG. 4C. In this example, the ion doping is preferably carried out under a condition that the ion doping energy is 400 KeV and the ion dosage $10^{15}/cm^2$. Also, in this example, like the previous example, the photoresist 47 and the silicon dioxide layer 43 serve as a mask to permit boron to automatically and selectively be doped into desired locations in the substrate. Then, with a mask of the photoresist 47, the nitride film 46 is etched away. In this case, intentionally elongating the etching time makes an excessive etching to form a gap of about one micron between the peripheral edges of the photoresist 47 and of the silicon nitride 46, as shown in FIG. 4D. Subsequently, the photoresist 47 is removed and the semiconductor substrate is subjected to the thermal oxidation treatment. As a result of the thermal oxidation treatment, the portions of the polycrystalline silicon layer 45 not covered with the silicon nitride layer 46 are selectively oxidized to be converted into silicon dioxide layers 400, 400' and 400" so that the portions of the polycrystalline silicon layer covered with silicon nitride layer are electrically isolated as the electrode wiring paths 401 and 402 while at the same time the boron doped region 48 thermally spreads in the substrate to form a P-type region 49', as shown in FIG. 4E. Then, the silicon nitride layer overlaying the gate electrode 401 is selectively removed, being followed by addition of highly concentrated boron by the thermal diffusion technique. In this case, boron is introduced into the monocrystalline region 41 by way of the gate electrode 401 made of polycrystalline silicon, with the result that the introduced boron is connected with the P-type region 49 previously introduced to form a P-type gate region 403, as shown in FIG. 4F. After the formation of the gate region, the substrate is subject to the thermal oxidation treatment to form a silicon dioxide layer 404 over the gate electrode 401, as shown in FIG. 4G. After removal of the remaining silicon nitride layer 406 covering the source electrode 402, highly concentrated boron is diffused by the thermal diffusion technique. At this time, the boron is introduced into the monocrystalline region 41 through the source electrode 402 of polycrystalline silicon, thereby to form an N-type impurity doped region 407, as shown in FIG. 4H. At the final step, the silicon dioxide layer covering the gate electrode 404 is opened at a desired location to form metal wiring paths 408 and 409 of aluminum. In this manner, an N-channel junction field effect transistor according to the invention is manufactured with the metal wiring path 408 for a gate electrode, the metal wiring path 409 for a source electrode and the N type silicon substrate 40 for a drain electrode, as shown in FIGS. 4 I and I'.

As described above, in the invention, impurity material is selectively doped into the substrate region through a polycrystalline silicon layer and then the silicon layer portion where the impurity material has passed through is converted into an oxide. The relative position of the electrode wiring paths to the impurity doped region formed in the substrate may precisely and automatically be determined not through a so-called "alignment operation". The surface of the electrode wiring paths of polycrystalline silicon of the semiconductor device is substantially flat.

I claim:

1. A method of manufacturing a semiconductor device comprising the steps of depositing a silicon layer on a semiconductor substrate selectively covered with a first insulating layer whereby at least one portion of the silicon layer is in contact with the exposed area of the semiconductor substrate, covering the surface of the silicon layer with an oxidation-resistant layer, forming a predetermined pattern of a mask material on the oxidation-resistant layer, introducing an impurity of a conductivity type opposite to that of the exposed area of the semiconductor substrate into the exposed area through a part of the portion of said silicon layer using the mask material, selectively removing the oxidation-resistant layer by using the mask material, selectively oxidizing the silicon layer to its entire thickness by using the retained oxidation-resistant layer as a mask whereby at least the part of the portion of the silicon layer not covered by the oxidation-resistant layer is oxidized, forming a first opposite conductivity type region in the exposed area of the semiconductor substrate by the impurity introduced therein, and introducing an impurity of the same conductivity type as the first opposite conductivity type region into the exposed area of the semiconductor substrate through a non-oxidized part of the silicon layer to form a second opposite conductivity type region in the exposed area in contact with the first opposite conductivity type region.

2. The method according to claim 1, wherein the first opposite conductivity type region and the second opposite conductivity type region form a gate region and a gate contact region of a junction field-effect transistor, respectively.

3. The method according to claim 1, wherein the first opposite conductivity type region comprises a drain region and a source region of a MOS field effect transistor and the second opposite type conductivity region comprises a drain contact region in contact with the drain region and a source contact region in contact with the source region.

4. The method according to claim 2, further comprising the step of introducing an impurity having the same conductivity type as the semiconductor substrate through a second non-oxidized part of the silicon layer to form a drain region of the junction field effect transistor.

5. A method of manufacturing a semiconductor device comprising the steps of preparing a semiconductor substrate, forming an insulator film having at least one opening on a principal face of the semiconductor substrate, depositing a silicon layer on both the insulator film and the opening, depositing an oxidation-resistant film on the silicon layer, forming an etching-resistant layer having at least one opening, at least a part of the opening of the etching-resistant film being superposed on the opening of the insulator film, introducing an impurity into a selected portion of the substrate to form an impurity doped region utilizing the etching-resistant layer as a mask, patterning the oxidation-resistant film utilizing the etching-resistant layer as a mask, selectively oxidizing the silicon layer by utilizing the patterned oxidation-resistant film, removing the patterned oxidation-resistant film, thereby exposing a surface of the silicon layer, and forming a wiring layer in contact with the exposed surface of the silicon layer.

6. The method according to claim 5, further comprising the step of transferring an impurity through the silicon layer to the semiconductor substrate.

7. The method according to claim 5, further comprising the step of oxidizing the exposed surface of the silicon layer.

8. The method according to claim 5, in which the silicon layer as deposited is a polycrystalline silicon layer.

9. The method according to claim 5, wherein the oxidation-resistant film comprises silicon nitride.

10. The method according to claim 5, in which said etching-resistant layer comprises a photoresist.

11. The method for fabricating a semiconductor device comprising the steps of preparing a semiconductor substrate having a principal surface selectively covered with a first insulating layer, depositing a silicon layer on the principal surface, depositing an oxidation-resistant layer on the silicon layer, depositing mask layer having a predetermined pattern on the oxidation-resistant layer, introducing an impurity into a selected portion of said substrate by utilizing the mask layer as a mask, patterning said oxidation-resistant layer by utilizing the mask layer of said oxidation-resistant layer, and oxidizing said silicon layer to its entire thickness by using the retained oxidation-resistant layer thereby to define a wiring pattern in the silicon layer.

12. A method for fabricating a semiconductor device comprising the steps of preparing a semiconductor substrate having a principal surface selectively covered with an insulator film, depositing a silicon layer on the principal surface of the substrate, depositing an oxidation-resistant layer on the silicon layer, forming a mask layer having a predetermined pattern on the silicon layer, introducing a first impurity into a portion of the semiconductor substrate through the oxidation-resistant layer and the silicon layer by using the mask layer as a mask, selectively removing portions of the oxidation-resistant layer not covered by the mask layer and portions of the oxidation-resistant layer located at peripheral edges of the predetermined pattern by using the mask layer as a mask, and selectively oxidizing the silicon layer to its entire thickness using the retained portion of the oxidation-resistant layer.

13. The method according to claim 12, further comprising the steps of removing the retained portion of the oxidation-resistant layer to thereby expose a non-oxidized portion of the silicon layer, and oxidizing a surface of the non-oxidized portion.

14. The method according to claim 12, further comprising the steps of introducing a second impurity into the semiconductor substrate so as to contact with the introduced first impurity through the non-oxidized portion of the silicon layer.

15. The method according to claim 13, further comprising the steps of removing a part of the oxidized surface of the silicon layer, and forming a wiring layer connected to the non-oxidized portion of the silicon layer through the removed part of the oxidized surface.

16. The method according to claim 12, further comprising the steps of removing the retained oxidation-resistant layer to thereby expose a surface of the non-oxidized portion of the silicon layer, introducing a second impurity into the semiconductor substrate through the non-oxidized portion of the silicon layer, oxidizing a surface of the non-oxidized portion of the silicon layer, selectively removing a part of the oxidized surface of the silicon layer, and forming a wiring connected to the non-oxidized portion of the silicon layer through the removed part of the oxidized surface.

17. The method according to claim 14 or 16, in which the first and second impurities are of the same conductivity type which is opposite to that of the semiconductor substrate.

* * * * *

UNITED STATES PATENT AND TRADEMARK OFFICE
CERTIFICATE OF CORRECTION

PATENT NO. : 4,306,915
DATED : December 22, 1981
INVENTOR(S) : Hiroshi SHIBA

It is certified that error appears in the above—identified patent and that said Letters Patent is hereby corrected as shown below:

Column 4, line 46, after "48" insert -- and 48' --

Column 5, line 1, after "49" insert -- and 49 --

Signed and Sealed this

Twenty-seventh Day of July 1982

[SEAL]

Attest:

GERALD J. MOSSINGHOFF

Attesting Officer

Commissioner of Patents and Trademarks